(12) United States Patent
Peng

(10) Patent No.: US 7,277,280 B2
(45) Date of Patent: Oct. 2, 2007

(54) HEAT DISSIPATION DEVICE HAVING A DUAL-FAN ARRANGEMENT

(75) Inventor: Xue-Wen Peng, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 57 days.

(21) Appl. No.: 11/164,498

(22) Filed: Nov. 25, 2005

(65) Prior Publication Data

US 2007/0121289 A1 May 31, 2007

(51) Int. Cl.
*H05K 7/20* (2006.01)
(52) U.S. Cl. ...................................... 361/695; 361/697
(58) Field of Classification Search ................ 361/695, 361/696
See application file for complete search history.

(56) References Cited

U.S. PATENT DOCUMENTS

| | | | | |
|---|---|---|---|---|
| 5,638,895 A * | 6/1997 | Dodson | ...................... | 165/121 |
| 5,953,209 A * | 9/1999 | Chiu | ........................... | 361/697 |
| 6,181,556 B1 * | 1/2001 | Allman | ....................... | 361/690 |
| 6,496,368 B2 * | 12/2002 | Jui-Yuan | ..................... | 361/697 |
| 6,778,392 B2 * | 8/2004 | Chiou | ........................ | 361/697 |
| 6,795,315 B1 * | 9/2004 | Wu et al. | .................... | 361/695 |
| 6,804,115 B2 * | 10/2004 | Lai | ............................. | 361/695 |
| 7,023,696 B2 * | 4/2006 | Ko | .............................. | 361/695 |
| 2005/0141993 A1 | 6/2005 | Hung | | |
| 2005/0280990 A1 * | 12/2005 | Goodenough et al. | ...... | 361/695 |

* cited by examiner

*Primary Examiner*—Hae Moon Hyeon
(74) *Attorney, Agent, or Firm*—Wei Te Chung

(57) ABSTRACT

A heat dissipation device includes a heat sink (22), a first fan (24) disposed on one part of the heat sink, a second fan (26) disposed on another part of the heat sink and a cover (30) disposed to enclose the heat sink, the first fan and the second fan. The second fan draws the air produced by the first fan and flowing through the heat sink to quickly leave the heat sink.

18 Claims, 4 Drawing Sheets

HEAT DISSIPATION DEVICE HAVING A DUAL-FAN ARRANGEMENT

FIELD OF THE INVENTION

The present invention generally relates to a heat dissipation device for removing heat from an electronic component, and particularly to a heat dissipation device comprising double fans to enhance an airflow flowing through a heat sink in contact with the electronic component, which is mounted on a periphery card.

DESCRIPTION OF RELATED ART

With advancement of computer technology, electronic devices operate with high speeds. It is well known that the more rapidly the electronic devices operate, the more heat they generate. If the heat is not dissipated duly, the stability of the operation of the electronic devices will be impacted severely.

Generally, in order to ensure the electronic device to run normally, a heat dissipation device is used to dissipate the heat generated by the electronic device. A conventional heat dissipation device includes a heat sink and a fan attached on a top of the heat sink. The heat sink includes a base contacting a heat-generating electronic component like a CPU and a plurality of fins extending upwardly from the base. Most of the heat generated by the heat-generating electronic component is absorbed by the base, and conducted upwardly to the fins. The fan blows air directly to the fins from the top of the heat sink to enhance heat-exchange between the fins and air around the fins.

However, when the air flows from the top of the fins to the bottom of the fins, most of the air is heated and the heated air is concentrated on the bottom of the fins. The heated air cannot be quickly and effectively expelled from the bottom of the fins. Thus, heat dissipation efficiency of the fins is poor and the heat transfer efficiency between the base and the bottom of the fins is low. Heat transfer speed from the base to the fins needs improvement greatly. Thus, a heat dissipation device which can quickly remove the heated air from the fins, particularly the bottom of the fins, is needed. Such a heat dissipation device is particularly necessary for a periphery card of a computer, for example, a video graphic array (VGA) card. A periphery card is usually crowded with other periphery cards whereby only a limited space is available for an airflow to flow through a heat sink thereof. Heat accumulated at bottom of the fins of the heat sink of the periphery card is particularly serious, which requires an immediate solution.

SUMMARY OF INVENTION

A heat dissipation device in accordance with a preferred embodiment of the present invention comprises a heat sink, a first fan disposed on one part of the heat sink, a second fan disposed on another part of the heat sink and a cover disposed to enclose the heat sink, the first fan and the second fan. The second fan helps the airflow produced by the first fan flowing to the heat sink to quickly leave the heat sink so that heat absorbed by the heat sink from a heat-generating electronic component can be quickly and efficiently taken away. The cover defines communicable first and second rooms. The first fan is received in the first room, while the second fan is received in the second room.

Other advantages and novel features will become more apparent from the following detailed description of preferred embodiments when taken in conjunction with the accompanying drawings, in which:

DETAILED DESCRIPTION

Figure 1:
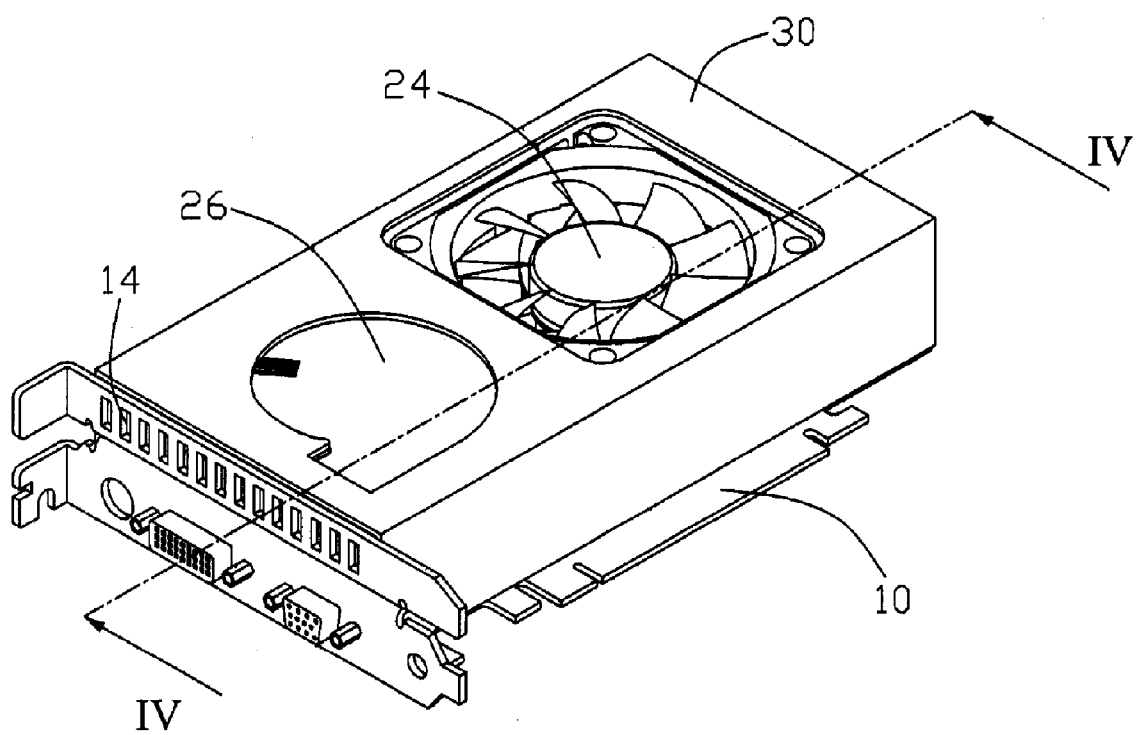
FIG. 1 is an isometric view of a heat dissipation device in accordance with a preferred embodiment of the present invention, mounted on a printed circuit board of a VGA card.

FIG. 1 shows a heat dissipation device in accordance with a preferred embodiment of the present invention, mounted on a printed circuit board 10 of a VGA card. The printed circuit board 10 has a heat-generating electronic component 12 (FIG. 2) attached thereon, which is a graphic processing unit (GPU) in this embodiment.

Figure 2:
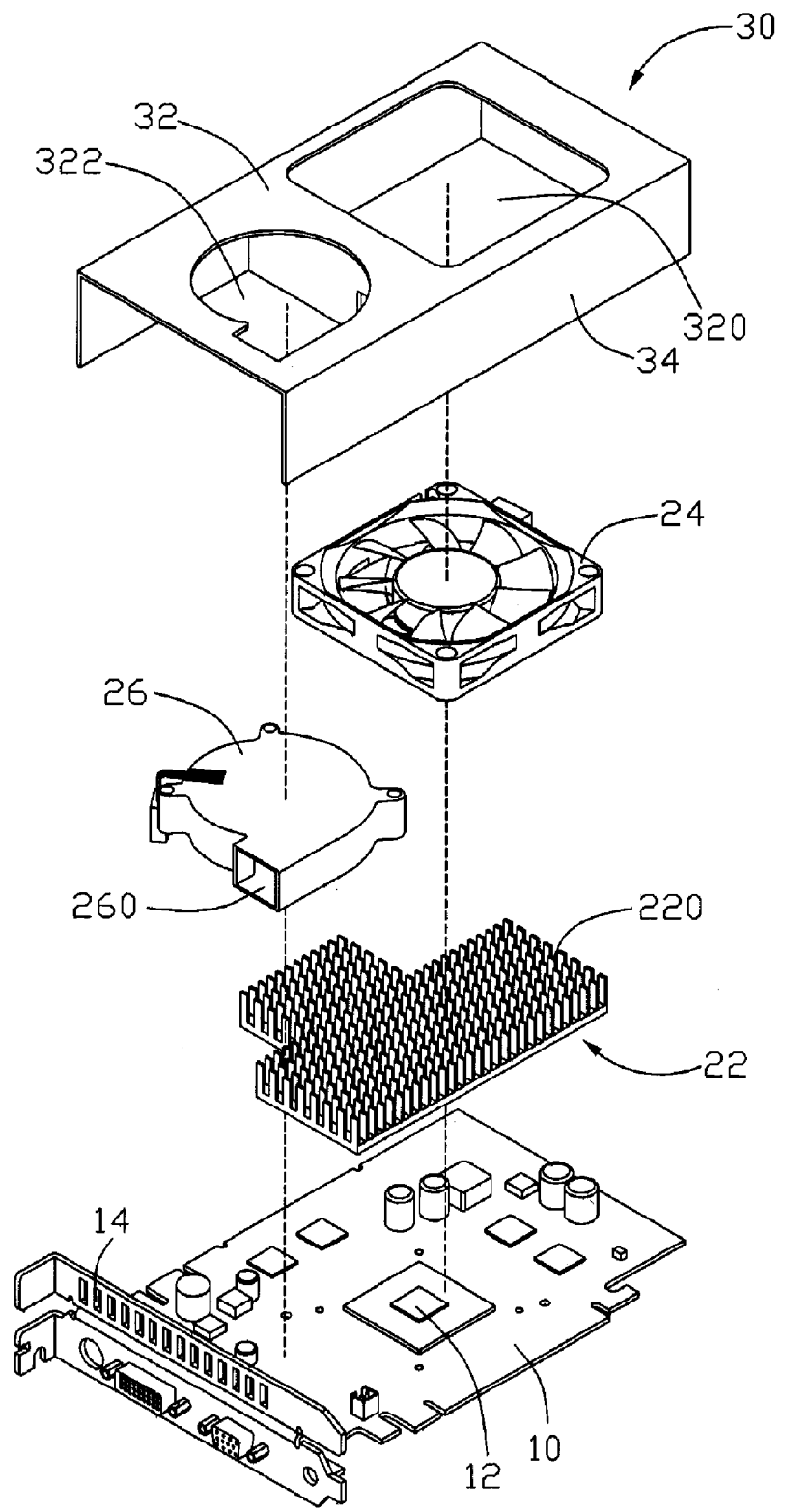
FIG. 2 is an exploded view of the heat dissipation device of FIG. 1.
Figure 3:
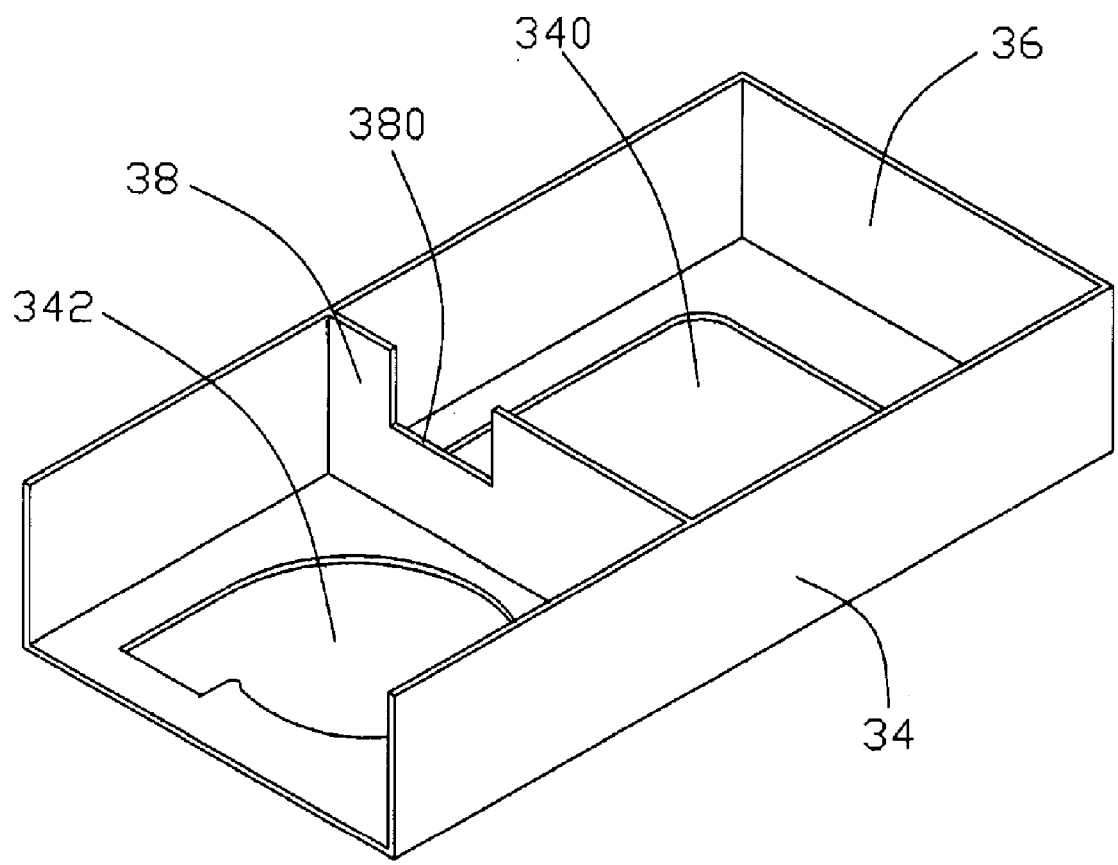
FIG. 3 is an enlarged bottom view of a cover of FIG. 1.

Also referring to FIGS. 2-3, the heat dissipation device comprises a heat sink 22, a first fan 24, a second fan 26 and a cover 30. The heat sink 22 has a bottom base (not labeled) contacting with the heat-generating electronic component 12 to receive heat generated by the heat-generating electronic component 12. A plurality of fins 220 is extended upwardly from the base to dissipate the heat on the base to ambient air. The first fan 24, which is an axial fan, is disposed on a top of the fins 220 of the heat sink 22 and produces an airflow to directly flow from the top of the fins 220 to a bottom of the fins 220 of the heat sink 22. The second fan 26, which is a blower, is also mounted on the top of the heat sink 22 and located near the first fan 24. The second fan 26 comprises an airflow inlet (not labeled) in a bottom surface thereof and an airflow outlet 260 at a lateral side thereof. The airflow outlet 260 is arranged to be adjacent to and face an exit 14 of the VGA card, which is communicated with a surrounding air of a computer system in which the VGA card is mounted.

The cover 30 is disposed on tops of the first and second fans 24, 26 to enclose the heat sink 22, the first and second fans 24, 26. The cover 30 comprises a body 32, a pair of elongated opposite baffles 34 and a short baffle 36 respectively extending perpendicularly downwards from three sides of the body 32. The short baffle 36 is located between the baffles 34. The baffles 34 are arranged to enclose a pair of lateral sides of the heat sink 22. The baffles 34, 36 have bottoms connected to the printed circuit board 10. The body 32 defines a first hole 320 corresponding to the first fan 24 and a second hole 322 corresponding to the second fan 26. In a bottom view of the cover 30 in FIG. 3, a clapboard 38 is formed inside of the cover 30. The clapboard 38 divides an inner space of the cover 30 into a first room 340 corresponding to first hole 320 and receiving the first fan 24 therein, and a second room 342 corresponding to the second hole 322 and receiving the second fan 26 therein. The clapboard 38 defines a cutout 380 extending from a bottom to a middle of the clapboard 38. The cutout 380 provides a communication for allowing the airflow produced by the first fan 24 to enter the second room 342 from the first room 340. When the cover 30 is mounted to printed circuit board 10, the heat-generating electronic component 12 is located in the first room 340.

Figure 4:
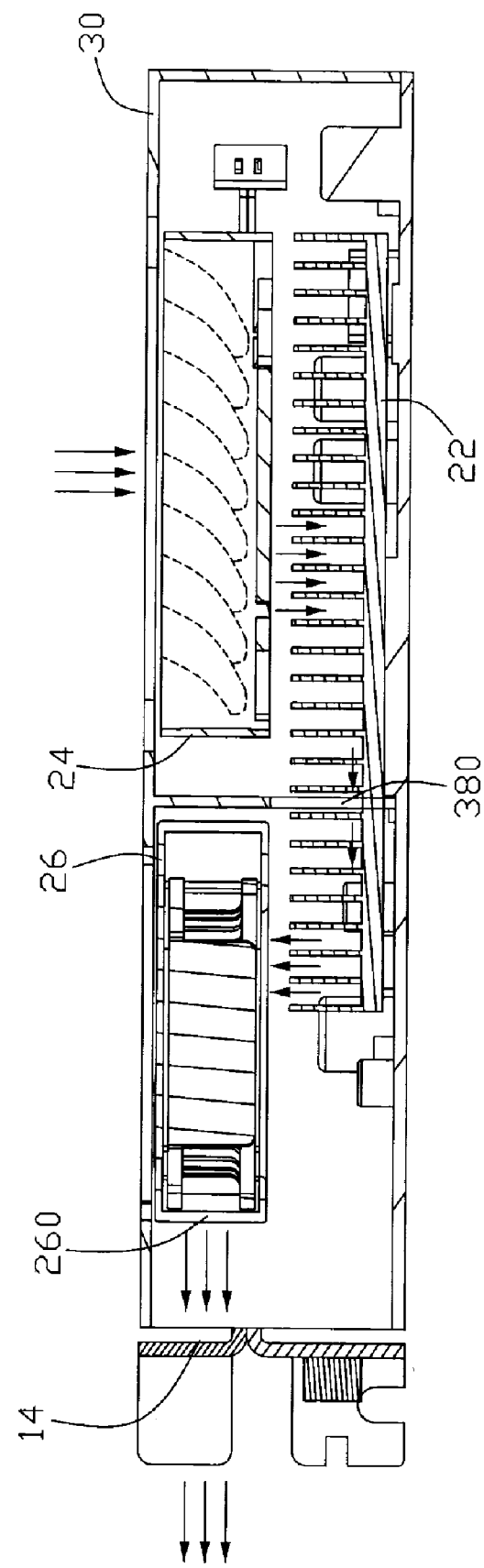
FIG. 4 is a cross-sectional view taken along line IV-IV in FIG. 1, showing airflow flowing paths through the heat dissipation device.

In operation, referring to FIG. 4, the heat generated by the heat-generating electronic component 12 is transferred to the bottom base of the heat sink 22 and then to the fins 220. The first fan 24 drives air to flow toward the top of the fins 220 of the heat sink 22. The air flows from the top to the bottom of fins 220 to have a heat exchange with the fins 220, whereby most of the air is heated. The heated air enters the second room 342 from the first room 340 through the cutout 380. Under the action of the second fan 26, the heated air enters the second fan 26 and is discharged to the surrounding air via the airflow outlet 260 of the second fan 26 and the exit 14. When the heated air leaves the bottom of the fins 220, new cooling air flows to the fins 220 again under the action of the first fan 24 to cool the fins 220 and accordingly the heat-generating electronic component 12. Since the second fan 260 is operated to draw the air in the second room 342 upwardly, the heated air in the bottom of the fins 220 in the first room 340 is also drawn to flow into the second room 342 via the cutout 380, whereby the heated air can quickly leave the bottom of the fins 220 to effectively take the heat therefrom. Thus, the heat dissipation efficiency of the bottom of the fins 220 is improved. Heat-transferred speed of the heat dissipation device has a great improvement.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
a heat sink;
a first fan disposed on one part of the heat sink;
a second fan having one portion thereof disposed on another part of the heat sink and another portion thereof extending beyond the heat sink, the second fan guiding an airflow produced by the first fan and flowing through the heat sink to leave the heat sink; and
a cover disposed to enclose the heat sink, the first and second fans.

2. The heat dissipation device as claimed in claim 1, wherein the first fan is an axial fan, the second fin is a blower drawing the airflow to leave the heat sink, the blower having an inlet and an outlet oriented perpendicular to each other.

3. The heat dissipation device as claimed in claim 1, wherein the heat sink comprises a plurality of fins, the first fan disposed on one part of the fins.

4. The heat dissipation device as claimed in claim 3, wherein the one portion of the second fan is disposed on another part of the fins.

5. The heat dissipation device as claimed in claim 3, wherein the one portion of the second fan is disposed on another part of the fins and located near the first fan.

6. The heat dissipation device as claimed in claim 1, wherein the cover forms a first room for receiving the first fan and said one part of the heat sink and a second room for receiving the second fan and said another part of the heat sink.

7. The heat dissipation device as claimed in claim 6, wherein the cover has a clapboard inside thereof to divide the cover into the first and second rooms.

8. The heat dissipation device as claimed in claim 7, wherein the clapboard defines a cutout therein providing a communication for the airflow to enter the second room from the first room.

9. The heat dissipation device as claimed in claim 1, wherein the cover comprises a body and a plurality of baffles extending from the body to enclose lateral sides of the heat sink.

10. The heat dissipation device as claimed in claim 1 further comprising a printed circuit board having a heat-generating electronic component mounted thereon, the heat sink being attachable to the heat-generating electronic component.

11. The heat dissipation device as claimed in claim 10, wherein the second fan is a blower which has an inlet and an outlet oriented perpendicular to each other, the printed circuit board provides an exit for the air, the exit being arranged to face the outlet of the second fan.

12. An electronic device assembly comprising:
a printed circuit board having a heat-generating electronic component mounted thereon;
a heat sink attached on the electronic component and comprising a plurality of fins;
a first fan disposed on one part of the fins;
a second fan disposed on another part of the fins; and
a cover forming a first room for receiving the first fan and said one part of the fins and a second room for receiving the second fan and said the other part of the fins;
wherein air is blown by the first fan toward said one part of the fins and flows to said the other part of the fins and is drawn out of said the other part of the fins by the second fan.

13. The heat dissipation device as claimed in claim 12, wherein the first fan is disposed on a top of the fins.

14. The heat dissipation device as claimed in claim 13, wherein the second fan is disposed on a top of the fins and located near the first fan.

15. The heat dissipation device as claimed in claim 14, wherein the second fan is a blower drawing the air produced by the first fan and flowing through the fins to leave the fins.

16. A card device for a computer comprising:
a printed circuit board;
a heat-generating electronic component mounted on the printed circuit board;
a heat sink mounted on the heat-generating electronic component;
a cover mounted on the printed circuit board and enclosing the heat sink, the cover having a clapboard dividing an inner space of the cover into a first room and a second room, wherein the heat-generating electronic component is received in the first room and the first room and second room are communicated with each other through a void in the clapboard;
a first fan mounted in the first room for generating an airflow toward the heat sink; and
a second fan mounted in the second room for generating an airflow away from the heat sink;
wherein the first fan is an axial fan and the second fan is a blower, and wherein the heat sink extends in the first and second rooms.

17. The card device as claimed in claim 16, wherein the void is defined a bottom of the clapboard adjacent to the printed circuit board.

18. The card device as claimed 17, wherein the blower has an inlet in a bottom thereof, an outlet in a side thereof, the bottom of the blower being located above the heat sink, the card having an exit located adjacent to the outlet of the blower whereby the airflow generated by the second fan can flow out of the second room trough the outlet and exit to a surrounding air of the computer.

* * * * *